United States Patent
Jaszcar et al.

(10) Patent No.: US 8,823,412 B2
(45) Date of Patent: Sep. 2, 2014

(54) DEVICE AND METHOD FOR INSPECTION OF A STATOR CORE OF AN ELECTRICAL MACHINE

(75) Inventors: Michael P. Jaszcar, Murrysville, PA (US); Mark W. Fischer, Pittsburgh, PA (US)

(73) Assignee: Siemens Energy, Inc., Orlando, FL (US)

( * ) Notice: Subject to any disclaimer, the term of this patent is extended or adjusted under 35 U.S.C. 154(b) by 261 days.

(21) Appl. No.: 13/528,998

(22) Filed: Jun. 21, 2012

(65) Prior Publication Data
US 2013/0234752 A1 Sep. 12, 2013

(51) Int. Cl.
*G01R 31/34* (2006.01)

(52) U.S. Cl.
USPC ....... 324/765.01; 324/546; 324/557; 324/559

(58) Field of Classification Search
USPC ............ 324/765.01, 546, 547, 557, 559, 127
See application file for complete search history.

(56) References Cited

U.S. PATENT DOCUMENTS

| 5,105,658 | A | 4/1992 | Jaafar et al. |
| 6,876,222 | B2 | 4/2005 | Fischer et al. |
| 6,903,556 | B2 * | 6/2005 | Sutton ........................... 324/546 |
| 2004/0100270 | A1 | 5/2004 | Fischer et al. |
| 2005/0093536 | A1 | 5/2005 | Lee et al. |

FOREIGN PATENT DOCUMENTS

FR 2762157 A1 10/1998

* cited by examiner

*Primary Examiner* — Vincent Q Nguyen

(57) ABSTRACT

An automated EL CID inspection technique for the stator core of an electrical machine is provided. The inspection device includes a rail, a pickup coil and a coil support assembly. The coil support assembly includes a first part movable along the rail, and a second part where the pickup coil is actually installed. The second part is movable jointly with the first part along the rail, while also being movable relative to the first part in a direction towards or away from the stator core. A motor actuates a motion of the coil support assembly. During inspection, the motor is activated, upon which the coil support assembly moves along the rail while a specified distance is maintained between the stator core and the pickup coil by the relative motion between the first and second parts. The technique is particularly applicable in a step-iron portion of the stator core.

20 Claims, 5 Drawing Sheets

DEVICE AND METHOD FOR INSPECTION OF A STATOR CORE OF AN ELECTRICAL MACHINE

CROSS REFERENCE TO RELATED APPLICATIONS

The application claims the benefit of the provisional patent application filed on Mar. 6, 2012, and assigned application No. 61/607,159. All of the applications are incorporated by reference herein in their entirety.

FIELD OF INVENTION

The present invention relates generally to inspection of electrical machines using electromagnetic detectors, and more particularly, to an automated inspection device and method particularly applicable in a step-iron region of the stator core of the electrical machine.

BACKGROUND OF INVENTION

The stator cores of electrical generators and other electrical machines are made up of a stack of several, for example, thousands of individual steel sheets or laminations. The thickness of an individual sheet is typically measured in thousandths of an inch. Each of the laminations is coated with a thin layer of electrical insulation to insulate it electrically from its neighbors. This insulation prevents the alternating magnetic flux in the stator core from inducing eddy currents between laminations. If the insulation between adjacent laminations becomes damaged during assembly, operation or maintenance, a conducting path may be formed through which currents are induced by the alternating flux. These conducting currents create "hot spots" which, if undetected, can result in failure of the machine.

One type of apparatus suitable for detecting such stator core hot spots is an Electro-magnetic Core Imperfection Detector ("EL CID"). An EL CID detects potential hot spots electromagnetically by exciting the stator core and then measuring any resulting fault currents flowing through a damaged region. Typically, the EL CID's sensors are held against the stator core laminations and transported along the length of the stator core. As the sensors scan axially along the length of the core, they produce an analog signal having a magnitude proportional to detected fault currents. By examining a plot of the magnitude of the analog signal versus the sensor distance along the length of the core, operators are able to detect the location of a damaged insulation.

SUMMARY OF INVENTION

A stator core has a cylindrical bore within which the rotor is to be installed. The bore has a generally constant diameter, except at its axial ends, where the diameter increases along the axis towards the respective end. The increase in diameter is stepped, because of which the portion adjacent to the axial end of the stator core is referred to as "step iron." The step-iron portion facilitates in reducing the magnetic flux densities at the ends of the stator core.

During inspection using EL CID, the scanning operation at the main section of the stator core, (i.e., the cylindrical portion having constant diameter), may carried out by an automated tool, for example by using a belt driven carriage for the sensor riding on the inside diameter of the stator core in an axial direction. The problem arises at the step iron portion of the stator core wherein it is difficult to obtain accurate readings from the sensor due to the abrupt changes in contour axially over that region. The stepped changes in the region's contour make it difficult even to manually, smoothly move the sensor over that region to avoid distorted outputs. Of course, it is even more difficult to avoid distorted outputs when an automated tool of the above-mentioned type is used to move the sensor over the step iron portion.

The present technique provides a device and a method which can be used for accurately inspecting any portion of the stator core of an electrical machine, including the step-iron portion. The embodiments disclosed herein particularly provide an automated EL CID scanning of the step-iron portion of the stator core which is capable of providing substantially accurate data, which is not possible in the case of the above-mentioned tools.

The inspection device is provided with a pickup coil, which functions as an electromagnetic sensor/detector, and a rail. The pickup coil is supported by a coil support assembly which moves along the rail during the inspection operation. In order to take into account the irregularity of the stepped contour of the step-iron portion, the coil support assembly is provided with at least two parts that are movable relative to each other. This includes a first part which is movable along the rail, and a second part where the pickup coil is actually installed. The second part moves jointly with the first part along the rail, while also being movable relative to the first part in a direction towards or away from the stator core. A drive motor actuates a motion of the coil support assembly, including the first and second parts.

During an inspection operation, the device is secured to the stator core such that the rail extends along the axis of the core, and the drive motor is activated. Upon activation of the drive motor, the coil support assembly moves along the rail while a constant or specified distance is maintained between the stator core and the pickup coil by the relative motion of the second part with respect to the first part.

The inspection operation would additionally involve an energization of the stator core, upon which the pickup coil is in electromagnetic communication with the energized stator core, so as to locally measure eddy currents in the stator core and to provide a signal proportional to a locally measured eddy current. The signal from the pickup coil is then evaluated to determine a faulty region in the stator core.

The movement of the second part that bears the pickup coil towards the surface of the stator core may, for example, be facilitated by providing a bias to the second part towards the stator core. The bias towards the stator core functions to maintain the constant distance of the pickup coil with respect to the core.

In an exemplary embodiment, the bias may be provided by spring-mounting the second part on the first part.

The second part bearing the pickup coil may also be mounted on a wheel. The wheel accurately follows the contour of the portion of the stator core as it moves along the rail, which maintains the pickup coil at a known distance away from the stator core, resulting in accurate output data.

In one embodiment, the second part is an adjustable coil mount that receives a sensing end of the pickup coil, allowing the distance of the pickup coil from the stator core to be adjusted. Using the adjustable coil mount, a predetermined optimum distance between the coil and core can be established during installation.

In a further embodiment, the first part extends transversely across the rail and supports two second parts, one on either side of the rail. Each second part has a respective sensing end of the pickup coil installed on it. Furthermore, the first part may be slotted in a transverse direction, such that a width between the two second parts is adjustable by shifting either or both of the two second parts along the slotted curve holder. This allows a provision for adjusting the inspection device to different slot widths of the stator core.

The pickup coil may include any electromagnetic detector capable of electromagnetic communication with the stator core. An example of such a detector is a Chattock coil.

In one embodiment, a guide assembly is provided which is movably mounted on the rail and configured for guiding the coil support assembly along the rail.

As mentioned earlier, during inspection, the device is secured to the stator core of the electrical machine. For this purpose, for example, a magnet or even a series of magnets may be employed.

For linking the drive motor to the coil support assembly, the device may incorporate any suitable drive mechanism, such as a screw drive unit or a belt drive unit, among others.

In another aspect, an automated method is provided for inspecting a step iron portion of the stator core of an electrical machine using an inspection device. The inspection device includes a pickup coil arranged to be in axial motion along the stator core, and a motor for driving the axial motion. To accommodate the stepped contour of the step-iron portion, the pickup coil is configured to be movable in a direction towards and/or away from the stator core, concurrently with its axial motion. As per the method, the inspection device is secured to the stator core, the stator core is energized, and a control is established to drive the motor so as to move the pickup coil axially along the stator core. The pickup coil is in electromagnetic communication with the energized stator core, so as to locally measure eddy currents in the stator core and to provide a signal proportional to a locally measured eddy current. As the pickup coil is moved axially along the step-iron portion, the pickup coil is simultaneously moved in said direction to maintain a specified distance between the stator core and the pickup coil.

The maintenance of a specified distance ensures that the signal obtained from the pickup coil is substantially error free as the pickup coil traverses over the step-iron portion. One way of realizing this feature is by installing the pickup coil on the inspection device with a bias towards the stator core. The bias may be provided, for example, by a spring. The motion of the pickup coil may also be guided on a wheel that follows the contour of step-iron portion of the stator core as the pickup coil is moved axially.

The signal from the pickup coil is evaluated, for example, to determine a hot spot in the step-iron portion. Such a hot spot is detected when the locally measured eddy current corresponds to a fault value.

BRIEF DESCRIPTION OF THE DRAWINGS

The invention is shown in more detail by help of figures. The figures show preferred configurations and do not limit the scope of the invention.

DETAILED DESCRIPTION OF INVENTION

Specific embodiments described below provide a device and a method, particularly adapted for performing an EL CID test on the stator core of an electrical machine over the main section and on the step iron regions. The exemplary electrical machine is a generator. The existing manual as well as automated tools for EL CID testing pose difficulties in the correct manipulation of the electromagnetic sensor (also referred to herein as "pickup coil"), especially over the step iron portion. If the pickup coil is not maneuvered correctly, the output readings could be distorted and mask damaged insulation. The embodiments described below overcome those difficulties by providing an automated tool capable of accurately monitoring the step iron portion of the stator, as well as the straight main section of the stator.

Figure 1:
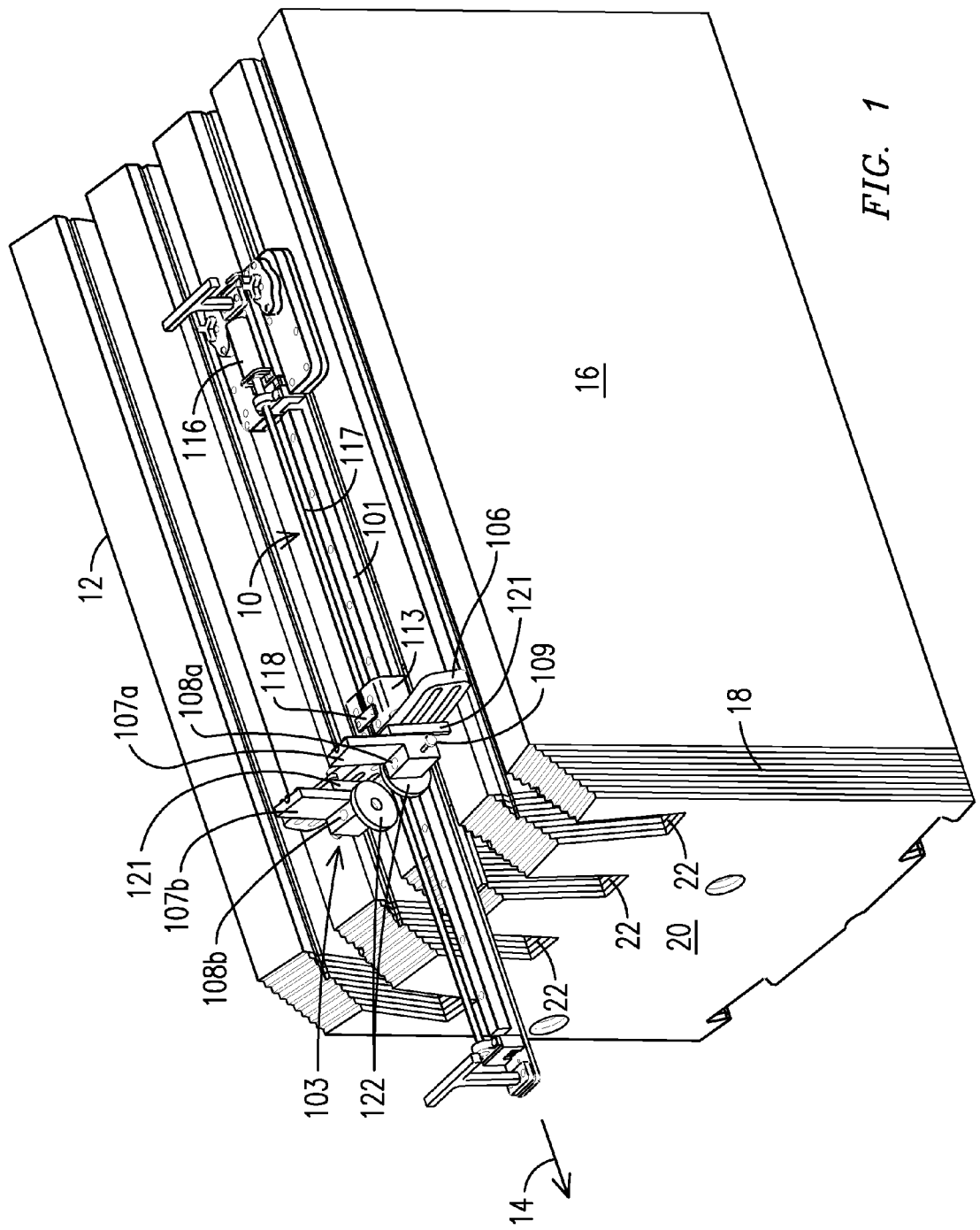
FIG. 1 illustrates a first embodiment of an EL CID inspection device incorporating a screw drive.

FIG. 1 illustrates an exemplary embodiment of an EL CID inspection device 10 positioned on the stator core 12 of a generator. The stator core 12 has an axis extending parallel to the direction designated as 14, and includes a main section 16 and a step iron portion 18 adjacent to one of the ends 20. The main section 16 has a generally constant diameter along the axial direction, while the step iron portion 18 incorporates a stepped increase in diameter along the axial direction. The stator core 12 also includes a plurality of axially extending slots 22, with the inspection device 10 being positioned along one of the slots 22. During inspection, the device 10 is securely held in the slot position, for example by magnetic force.

Figure 2:
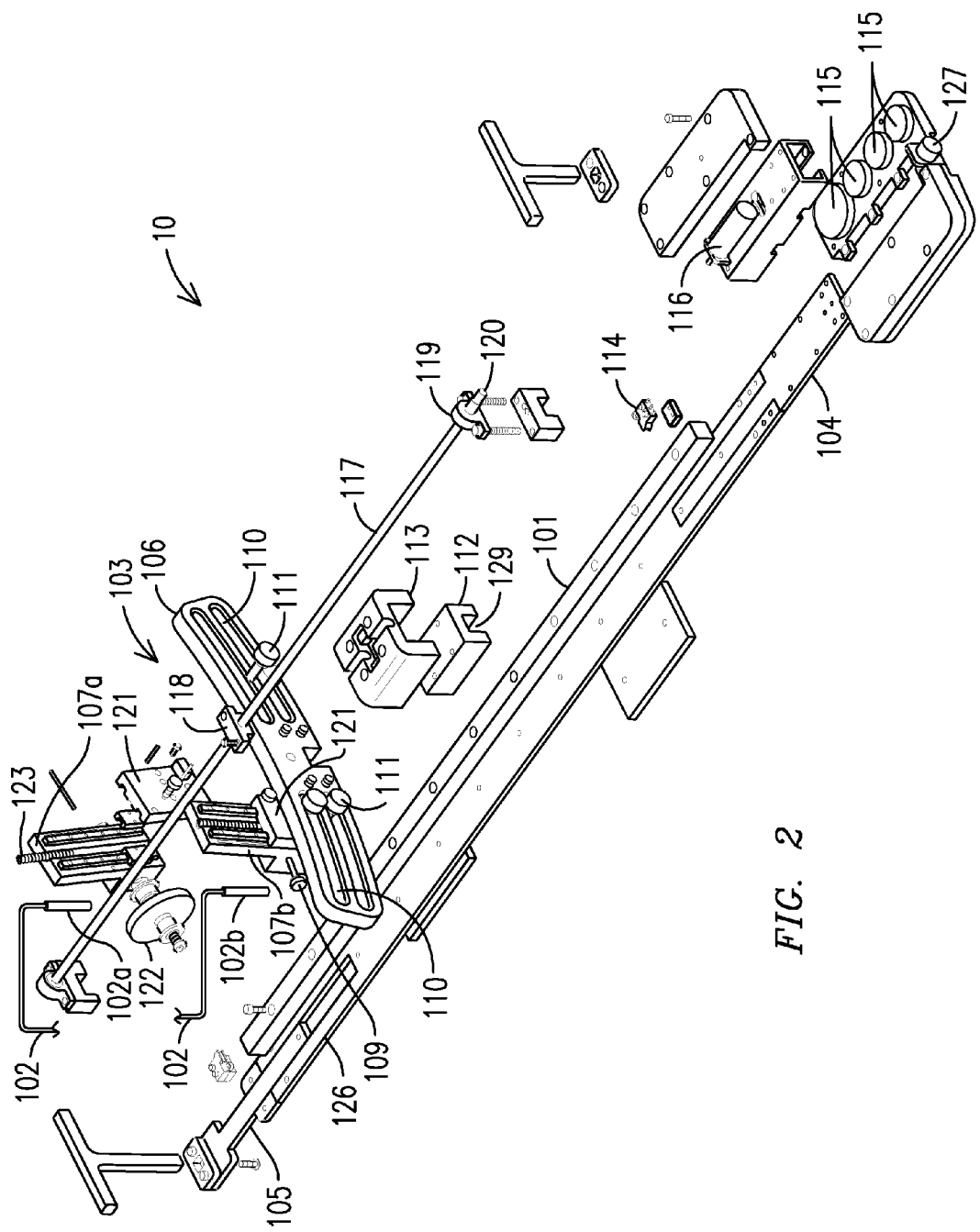
FIG. 2 shows an exploded view of the inspection device of FIG. 1.

FIG. 2 shows an exploded or unassembled view of the inspection device 10. The illustrated embodiment will be further described referring jointly to FIGS. 1 and 2. As shown, the inspection device broadly includes a rail 101, a pickup coil 102 having sensing ends 102a, 102b, a coil support assembly 103 capable of carrying the pickup coil 102 along the rail 101, and a motor 116 that actuates the movement of the coil support assembly 103 along the rail 101. The pickup coil 102 is an electromagnetic detector capable of electromagnetic communication with the stator core 12 during the inspection operation, when the stator core 12 is energized. In the example illustrated, the pickup coil 102 is embodied as a Chattock coil. The exemplary pick up coil 102 has a non-conductive core and has wire wrapped around it with a specified number of turn per inch along the length. The pickup coil 102 is not depicted in FIG. 1 for the sake of clarity, although it is to be understood that during operation, the pickup coil 102 is installed by inserting the sensing ends 102a, 102b into the respective slots 108a, 108b of the coil mounts 107a, 107b, illustrated in detail below. It is also to be understood that the sensing ends 102a and 102b are part of the same continuous pickup coil 102.

The rails 101 are supported by a rail support 126, which, along with inboard stiffeners 104 and outboard stiffeners 105, provide a strong back for mounting all of the depicted components of the device 10.

In the illustrated embodiment, the coil support assembly 103 is made up of a transverse member 106 that is movable along the rail 101 and supports a coil mount 107a, 107b on either side of the rail 101. The coil mounts 107a and 107b are mounted so as to be jointly movable with the transverse member 106 along the rail 101. Each of the coil mounts 107a and 107b includes a respective slot 108a, 108b (visible in FIG. 2) through which a respective sensing end 102a, 102b of the pickup coil 102 is installed and secured in place, for example, by thumbscrews 109. The arrangement also allows the distance of the pickup coil 102, particularly the sensing ends 102a, 102b from the stator core 12 to be optimally adjusted during installation. This optimum distance is determined on the basis of the flux density of the core and/or the sensitivity of the coil, among other factors. In the present example, the distance may be chosen to be not more than 0.01 inches. For accurate measurements, it is desirable that this distance is maintained consistently as the pickup coil 102 traverses axially along the stator core 12 via the rail 101.

In the illustrated embodiment, each of the coil mounts 107a and 107b is mounted to the transverse member 106 in such a manner as to allow relative motion between the individual coil mounts 107a, 107b and the transverse member 106. This relative motion is in the direction of the surface of stator core 12. In this example, said relative motion would be perpendicular to both the rail 101 and the transverse member 106. Such an arrangement makes it possible to maintain a specified distance between the pickup coil sensing ends 102a and 102b and the stator core 12 even as the pickup coil 102 traverses over the step iron portion 18. The specified distance has constant optimum value determined as mentioned above, but may additionally take into account a known tolerance with respect to this optimum value.

To aid in the maintenance of a constant or specified distance of the pickup coil (i.e., the sensing ends) with respect to the stator core, the pickup coil may be installed with a bias towards the surface of the stator core. In illustrated embodiment, such a feature is realized by spring-mounting the coil mounts 107a, 107b to the transverse member 106. To this end, each coil mount support 107a, 107b is mounted on the transverse member 106 via a coil mount base 121. Each coil mount base 121 is essentially fixed to the transverse member 106, while slidably supporting the respective coil mount 107a, 107b. The coil mounts 107a and 107b are thus free to move relative to the respective coil mount base 121 in the direction towards, and away from, the surface of the stator core 12. The coil mounts 107a and 107b are further mounted on wheels 122 which contact the surface of the stator core 12 and follow the contour of the stator core 12 as the pick coil 102 is moved axially along the rail 101. A spring 123 biases each coil mount 107a, 107b and the respective wheel 122 towards the stator core 12. In particular, as the pickup coil 102 axially traverses over the step iron portion 18, the biasing action of the springs 123 ensures that the wheels 122 do not lose contact with the surface of the stator core 12, thus maintaining the specified distance between the pickup coil sensing ends 102a, 102b and the stator core 12 even at the step-iron portion 18.

Figure 5:
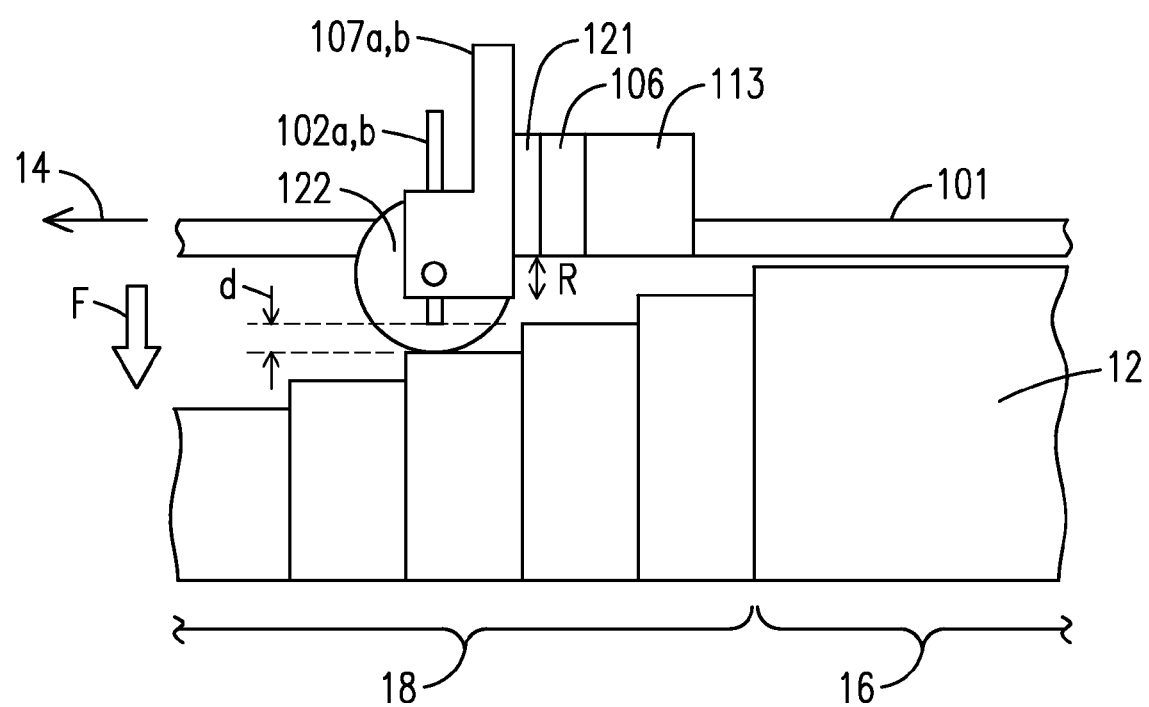
FIG. 5 is a schematic diagram illustrating how a constant distance between the stator core and the pickup coil is maintained in accordance with an embodiment of the present invention.

The above arrangement is schematically illustrated in FIG. 5, wherein the distance between the pickup coil sensing ends 102a, 102b and the stator core 12 is designated as "d". The relative motion of the coil mounts 107a, 107b with respect to the transverse member 106 is possible along the direction designated "R". This relative motion is constrained by the biasing force acting parallel to the direction designated as "F".

In the above-described embodiments, the biasing action is realized by way of a spring. However, the biasing may also be achieved by other mechanisms, for example, hydraulically, and/or by utilizing the force of gravity. Furthermore, instead of using wheels, it might also be possible to follow the contour of the step iron portion by temporarily employing a track or a ski along the slope of the step iron portion, along which the movable coil mounts can glide as the transverse member moves axially along the rail. In yet another embodiment, instead of employing a wheel proximity sensors or distance sensors could be provided on the coil or the coil mounts that would provide feedback to a motor that would control the distance between the pickup coil and the stator core, to maintain the specified distance between the two.

Referring back to FIGS. 1 and 2, the transverse member 106 is embodied as a curved holder having transversely extending slots 110. Adjustments for different slot widths of the slots 22 of the stator core 12 may be made by shifting one or both of the coil mounts 107a, 107b along the slotted curved holder 106. The coil mounts 107a, 107b are then secured to the curved holder 106 via the coil mount bases 121, for example, by thumbscrews 111.

In the embodiment illustrated, the motion of the coil support assembly 103 including the transverse member 106 and the coil mounts 107a, 107b along the rail 101 is guided by a guide assembly that includes a guide block 112 and a guide block mount 113. To this end, the guide block 112 is provided with a slot 129 that generally conforms to the shape of the rail 101, allowing the guide block 112 to slide over the rail 101. The guide block mount 113 is attached to the transverse member 106 of the coil support assembly 103. Additionally, limit switches 114, such as micro switches, may be provided to limit the amount of travel of the coil support assembly 103 in both directions. In this example, the limit switches 114 are configured to limit the amount of travel to about 24 inches. A series of magnets 115 secure the device 10 to the stator core 12 during the inspection operation.

The axial motion of the coil support assembly 103 is actuated by the drive motor 116. The drive motor 116 may include, for example, a variable speed DC motor. In the embodiment of FIGS. 1 and 2, a screw drive links the drive motor 116 to the coil support assembly and the guide assembly. The screw drive arrangement comprises an externally threaded rod 117, such as an acme rod, extending parallel to the rail 101, and a correspondingly internally threaded nut 119, such as an acme nut, which is fixed to the guide block assembly. The end of the acme rod 117 is supported by a bearing 119 and is rotationally coupled to the drive motor 116 via a coupling 120. When the motor 116 is activated, rotational torque from the motor 116 is communicated to the acme nut 118 by the acme rod 117, causing the acme nut 118 to translate linearly along the acme rod 117. This, in turn, causes the guide assembly, along with the coil support assembly, to move along the rail 101.

Figure 3:
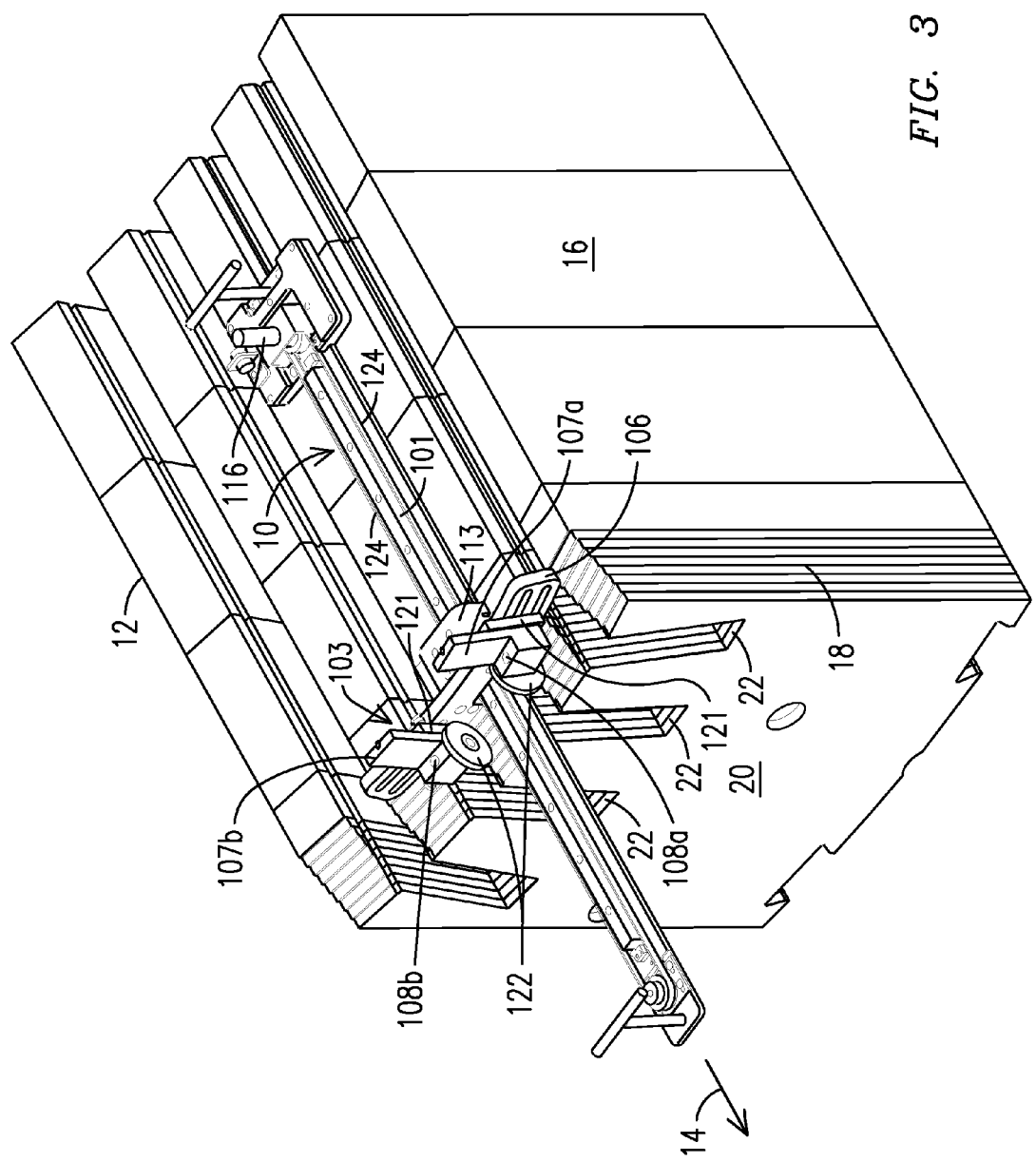
FIG. 3 illustrates a second embodiment of an EL CID inspection device incorporating a belt drive.
Figure 4:
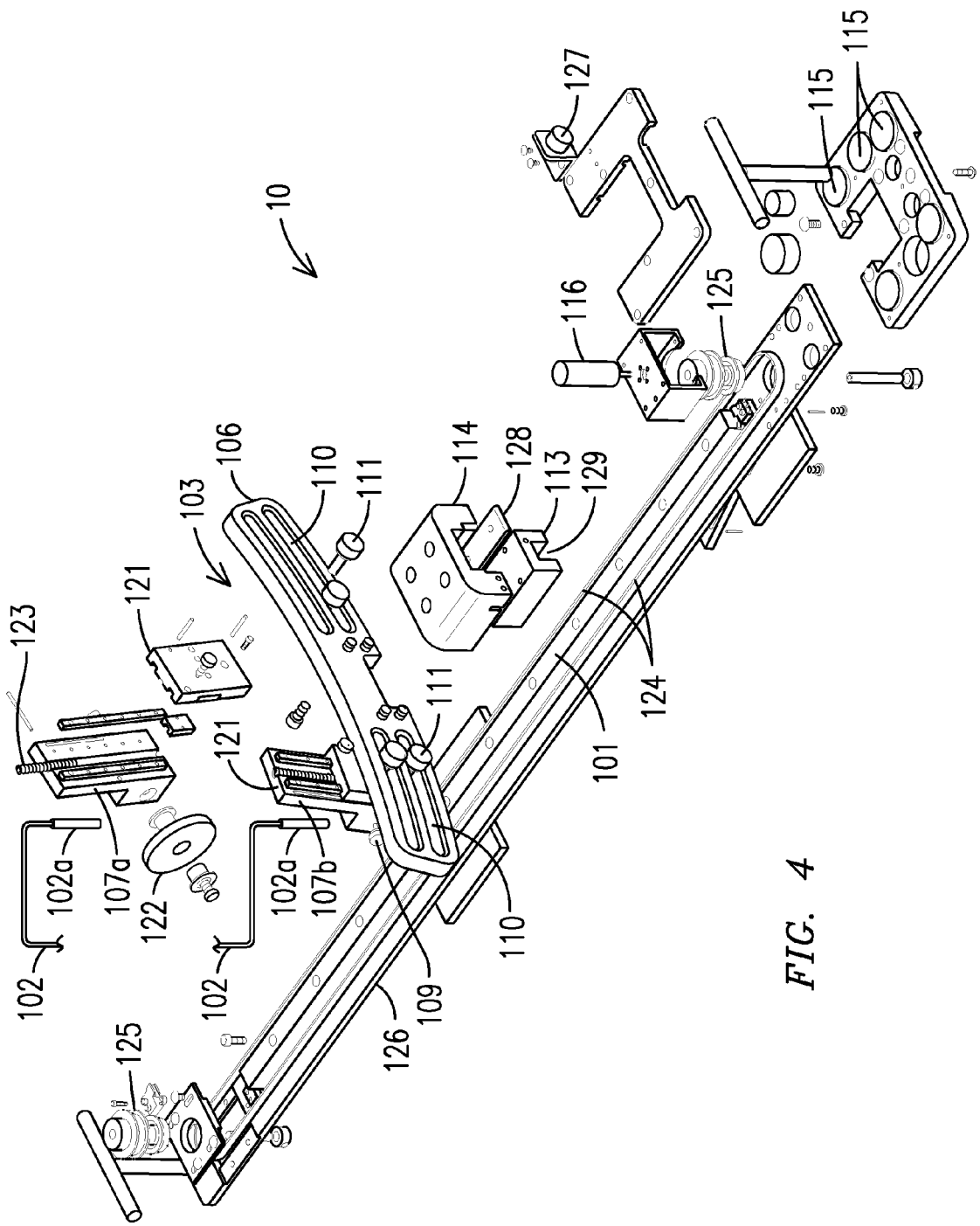
FIG. 4 shows an exploded view of the inspection device of FIG. 3.

FIGS. 3 and 4 illustrate an alternate embodiment incorporating a belt drive instead of a screw drive to actuate the axial motion along the rail. The views depicted in FIGS. 3 and 4 correspond to the views depicted in FIGS. 1 and 2 respectively. For the sake of clarity and conciseness, like numerals are used for designating like elements in the drawings.

As shown in FIGS. 3 and 4, the belt drive arrangement includes a conveyor belt 124, which is arranged around the rail 101 and supported at its ends by bearings 125. The belt 124 is driven by the motor 116, which is arranged perpendicular to the rail 101 in this case. The guide assembly is attached to the belt 124 only one side of the rail 101 via a belt keeper 128, while being free on the other side. Upon activation of the motor 116, the conveyor belt 124 is set in motion, causing the guide assembly and the coil support assembly to move along the rail 101.

The description below relates to an exemplary stator core inspection method with reference to the above-illustrated embodiments.

In operation, the device 10 is secured to the stator core 12 at the desired axial location such that the rail 101 is essentially parallel to the stator core axis. In the illustrated embodiments, a series of magnets 115 are used for this purpose. An electrical connection to a control box or data logger (not shown) is made via a connection 127. The inspection technique involves energization of the stator core 12. This may include employing an excitation loop wire (usually of several turns)

installed in the bore of the stator core 12. The loop may then be connected to a source of constant frequency amplitude-adjustable AC voltage and energized. The drive motor 116 is then activated and controlled, for example, remotely from the generator, to cause the pickup coil to move axially along the rail, at a predetermined speed, which may be constant or variable. The pickup coil 102 comes into electromagnetic communication with the energized stator core 12. As the pickup coil 102 is maneuvered along the axial length of the stator core 12, they pick up local eddy currents, in particular, fault currents due to faulty insulation in the laminations. A signal, typically of analog nature, is generated that corresponds to the magnitude of the locally measured eddy currents. The analog signal is appropriately processed and an evaluation is carried by plotting the locally measured signal versus the axial distance the pickup coil has traveled. A hot spot may be detected when the locally measured eddy current corresponds to a fault value. Especially as the pickup coil 102 traverses axially over the step iron portion 18, they are simultaneously moved in the direction towards or away from the surface of the stator core, to maintain a constant distance between the stator core and the pickup coil.

The operator and the control box are located outside of the generator during the entire scanning operation. At the end of every scan, a technician may reposition the device 10 to the next or adjacent stator slot 22 and repeat the procedure. For example, after scanning down the step iron portion 18 along one of the slots 22, the device 10 may be moved to the next slot 22 and the scan is performed going up the step iron portion 18 this time. A similar procedure may be implemented at the main section 16 of the stator core 12.

While specific embodiments have been described in detail, those with ordinary skill in the art will appreciate that various modifications and alternative to those details could be developed in light of the overall teachings of the disclosure. Accordingly, the particular arrangements disclosed are meant to be illustrative only and not limiting as to the scope of the invention, which is to be given the full breadth of the appended claims, and any and all equivalents thereof.

The invention claimed is:

1. A device for inspecting a portion of a stator core of an electrical machine, comprising:
   a rail,
   a pickup coil configured for electromagnetic communication with the stator core,
   a coil support assembly, comprising:
      a first part movable along the rail, and
      a second part on which the pickup coil is installed, the second part being movable jointly with the first part along the rail, and being further movable relative to the first part in a direction towards or away from the stator core, and
   a drive motor that actuates a motion of the coil support assembly along the rail,
   wherein as the coil support assembly moves along the rail, a specified distance is maintained between the stator core and the pickup coil by the relative motion of the second part with respect to the first part.

2. The device according to claim 1, wherein the portion of the stator core is a step-iron portion having a stepped increase in core-diameter along an axial direction, to resultantly have a stepped contour.

3. The device according to claim 1, wherein the second part is biased towards the stator core.

4. The device according to claim 3, wherein the biasing is provided by spring mounting the second part to the first part.

5. The device according to claim 3, wherein the second part is mounted on a wheel, such that the wheel follows the contour of the portion of the stator core as the coil support assembly moves along the rail.

6. The device according to claim 1, wherein the second part is configured to receive a sensing end of the pickup coil, such that a distance of the sensing end of the pickup coil from the stator core is adjustable during installation.

7. The device according to claim 6, wherein the first part extends transversely across the rail and supports two second parts, one on either side of the rail, each second part configured for receiving a respective sensing end of the pickup coil.

8. The device according to claim 7, wherein the first part is slotted in a transverse direction, and wherein a width between the second parts is adjustable by shifting either or both of the second parts along the slotted curve holder.

9. The device according to claim 1, wherein the pickup coil is a Chattock coil.

10. The device according to claim 1, further comprising a guide assembly movably mounted on the rail and configured for guiding the coil support assembly along the rail.

11. The device according to claim 1, further comprising a magnet for securing the device to the stator core of the electrical machine during inspection.

12. The device according to claim 1, further comprising a screw drive unit in communication with the drive motor for driving the coil support assembly along the rail.

13. The device according to claim 1, further comprising a belt drive unit in communication with the drive motor for driving the coil support assembly along the rail.

14. A method for inspecting a portion of a stator core of an electrical machine, comprising:
   securing the device according to claim 1 on the stator core, such that the rail extends along an axial direction with respect to the stator core, and
   activating the drive motor to move the coil support assembly along the rail while a constant distance is maintained between the stator core and the pickup coil by the relative motion of the second part with respect to the first part.

15. The method according to claim 14, further comprising:
   energizing the stator core, wherein the pickup coil is in electromagnetic communication with the energized stator core, so as to locally measure eddy currents in the stator core and to provide a signal proportional to a locally measured eddy current, and
   evaluating the signal to determine a faulty region in said portion of the stator core.

16. A method for automated inspection of a step iron portion of a stator core of an electrical machine, comprising:
   securing an inspection device to the stator core, the inspection device including a pickup coil arranged to be in axial motion along the stator core and a motor for driving the axial motion, the pickup coil being further movable in a direction towards or away from the stator core,
   energizing the stator core,
   controlling the motor to move the pickup coil axially along the stator core, the pickup coil being in electromagnetic communication with the energized stator core, so as to locally measure eddy currents in the stator core and to provide a signal proportional to a locally measured eddy current, and
   evaluating the signal obtained from the pickup coil,
   wherein, as pickup coil is moved axially along the step-iron portion, the pickup coil is simultaneously moved in said direction to maintain a specified distance between the stator core and the pickup coil.

17. The method according to claim 16, wherein the motion of the pickup coil along said direction is constrained by a biasing force acting in a direction towards the stator core.

18. The method according to claim 17, wherein the biasing force is provided by a spring.

19. The method according to claim 16, wherein the motion of the pickup coil is guided by a wheel that follows the contour of step-iron portion of the stator core as the pickup coil is moved axially.

20. The method according to claim 16, further comprising detecting a hot spot in the step iron portion of the stator core when the locally measured eddy current corresponds to a fault value.

\* \* \* \* \*